(12) United States Patent
Nong

(10) Patent No.: US 10,877,330 B2
(45) Date of Patent: Dec. 29, 2020

(54) DISPLAY DEVICE

(71) Applicants: HKC Corporation Limited, Guangdong (CN); Chongqing HKC Optoelectronics Technology Co., Ltd., Chongqing (CN)

(72) Inventor: Haiyan Nong, Guangdong (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 15 days.

(21) Appl. No.: 16/290,952

(22) Filed: Mar. 3, 2019

(65) Prior Publication Data

US 2020/0124897 A1    Apr. 23, 2020

Related U.S. Application Data

(63) Continuation of application No. PCT/CN2018/116879, filed on Nov. 22, 2018.

(30) Foreign Application Priority Data

Oct. 19, 2018    (CN) .......................... 2018 1 1220878

(51) Int. Cl.
| | |
|---|---|
| *H05K 7/10* | (2006.01) |
| *H05K 7/12* | (2006.01) |
| *G02F 1/1345* | (2006.01) |
| *H05K 1/11* | (2006.01) |
| *H05K 1/18* | (2006.01) |

(Continued)

(52) U.S. Cl.
CPC ......... *G02F 1/13452* (2013.01); *H05K 1/025* (2013.01); *H05K 1/0243* (2013.01); *H05K 1/11* (2013.01); *H05K 1/184* (2013.01); *G09G 3/3611* (2013.01); *H05K 2201/0939* (2013.01);
(Continued)

(58) Field of Classification Search
CPC .. G02F 1/13452; H05K 1/025; H05K 1/0243; H05K 1/11; H05K 1/184; H05K 2201/10522; H05K 2201/0939; H05K 2201/10303; H05K 2201/10136; G09G 3/3611
See application file for complete search history.

(56) References Cited

U.S. PATENT DOCUMENTS 6,853,428 B2 * 2/2005 Han .................... G02F 1/13452
                                                                349/139
7,812,912 B2 * 10/2010 Chen ...................... H01J 29/92
                                                                345/104

(Continued)

FOREIGN PATENT DOCUMENTS

| CN | 101266746 A | 9/2008 |
|---|---|---|
| CN | 102686026 A | 9/2012 |

(Continued)

*Primary Examiner* — Yuriy Semenenko

(57) ABSTRACT

Disclosed is a display device comprising: a display panel; a driver chip; the driver chip is provided with a plurality of chip pins disposed spaced from each other, and the distance between at least two adjacent chip pins is different from the distance value between the other two chip pins; and a driving circuit board, the driving circuit board is provided with a plurality of circuit board contact points, and a circuit board contact point is connected to a chip pin correspondingly.

7 Claims, 2 Drawing Sheets

(51) Int. Cl.
  *H05K 1/02* (2006.01)
  *G09G 3/36* (2006.01)
(52) U.S. Cl.
  CPC .............. *H05K 2201/10136* (2013.01); *H05K 2201/10303* (2013.01); *H05K 2201/10522* (2013.01)

(56) References Cited

U.S. PATENT DOCUMENTS

| | | | | |
|---|---|---|---|---|
| 2001/0015709 | A1* | 8/2001 | Imajo | G09G 3/2011 345/87 |
| 2001/0050571 | A1* | 12/2001 | Johnston | G01R 1/07357 324/754.14 |
| 2003/0123818 | A1* | 7/2003 | Watanabe | H05K 1/141 385/92 |
| 2007/0139575 | A1* | 6/2007 | Wang | G02F 1/133608 349/58 |
| 2008/0100556 | A1* | 5/2008 | Tseng | G02F 1/13452 345/95 |
| 2010/0085334 | A1* | 4/2010 | Kim | H01J 11/46 345/204 |
| 2010/0225624 | A1* | 9/2010 | Fu | G09G 3/20 345/205 |

FOREIGN PATENT DOCUMENTS

| | | |
|---|---|---|
| CN | 104952888 A | 9/2015 |
| CN | 106571116 A | 4/2017 |
| CN | 106973485 A | 7/2017 |
| CN | 107170366 A | 9/2017 |
| CN | 107749239 A | 3/2018 |
| CN | 107884963 A | 4/2018 |
| CN | 107946339 A | 4/2018 |
| CN | 108022515 A | 5/2018 |
| JP | 2005092218 A | 4/2005 |
| TW | 200837681 A | 9/2008 |

* cited by examiner

US 10,877,330 B2

DISPLAY DEVICE

CROSS-REFERENCE TO RELATED APPLICATIONS

This application is a continuation application of PCT application No. PCT/CN2018/116879 filed on Nov. 22, 2018, which claims priority to Chinese patent application No. 201811220878.0 filed on Oct. 19, 2018. The contents of all the above are incorporated herein by reference in their entirety.

FIELD

The present application relates to the field of display, and in particular, to a display device.

BACKGROUND

The statements herein merely provide background information related to the present application and do not necessarily constitute prior art.

In the display device, a LCD TV in a liquid crystal display device is taken as an example. The LCD TV includes: a liquid crystal glass panel, a driver chip (COF, also referred to as a driver IC), and a PCBA (driving circuit board). The liquid crystal glass and the driving circuit board are connected and fixed by a driver chip. And a plurality of pins is lead through circuits on the liquid crystal glass, COF, PCBA. After the pins are connected one by one, transmission of the power and the signal will be performed to meet the requirements of LCD TV driving and use. Pins of the current COF and PCBA are spaced of equal size. However, the functions of the pins are different, and so are the contents of the transmission; the signals transmitted by some pins are not required to be high, and the requirements on impedance are not high; and some pins have higher requirements on signal transmission and higher requirements on impedance. The different requirements are the same pin size and spacing. The performance of the product cannot be maximized.

SUMMARY

The main object of the present disclosure is to provide a display device designed to rationalize the layout of pins to improve product performance.

To achieve the above purpose, the display device proposed by the present application includes:

a display panel;

a driver chip electrically connected to the display panel, the driver chip is provided with a plurality of chip pins disposed spaced from each other, and the distance between at least two adjacent chip pins is different from the distance value between the other two chip pins; and a driving circuit board, the driving circuit board is provided with a plurality of circuit board contact points, and a circuit board contact point is connected to a chip pin correspondingly.

In an embodiment of the present application, the plurality of the chip pins include a first impedance pin and a second impedance pin. A distance value between the two second impedance pins is defined as W1, and the distance value between the two first impedance pins is defined as W2, and W1>W2;

In an embodiment of the present application, the range of the distance value W1 between the two second impedance pins is: 0.3 mm≤W1≤0.6 mm;

In an embodiment of the present application, the range of the distance value W2 between the two first impedance pins is: 0.1 mm≤W2≤0.3 mm;

In an embodiment of the present application, the second impedance pin includes a signal transmission pin.

In an embodiment of the present application, the first impedance pin includes a ground pin and a fill pin.

In an embodiment of the present application, the driving circuit board is provided with spliced eyes formed as circuit board contact points, and one of the chip pins is inserted-connected to one of the spliced eyes.

In an embodiment of the present application, the driving circuit board is provided with a mounting point formed as the circuit board contact point, and one of the chip pins is mounted and welded on one of the circuit board contact points.

In an embodiment of the present application, the display device comprises two of the driver chips, and the two of the driver chips are disposed apart from each at both ends of the driving circuit board.

In an embodiment of the present application, the display device is a television, a computer, or a mobile terminal.

In the technical solution of the present application, a plurality of chip pins of the driver chip can be applied to different signal function transmissions. The distance value between two adjacent chip pins is set to be different from the distance value between another two adjacent chip pins of the plurality of chip pins of the driver chip, and the circuit board contact points of the driving circuit board and the chip pins of the driver chip corresponds one by one, so the distance value between the two adjacent board contact points and another two adjacent circuit board contact points of the driving circuit board is also set to be different. In this way, adaptive settings can be made according to chip pins with different signal functions, thereby maximizing the performance of the display device using chip pins of different sizes and spacings.

BRIEF DESCRIPTION OF THE DRAWINGS

In order to illustrate the technical schemes in the embodiments of the present application or in the prior art more clearly, the drawings which are required to be used in the description of the embodiments or the prior art are briefly described below. It is obvious that the drawings described below are only some embodiments of the present application. It is apparent to those of ordinary skill in the art that other drawings may be obtained based on the structures shown in accompanying drawings without inventive effort.

DESCRIPTION OF THE REFERENCE NUMERALS

Figure 1:
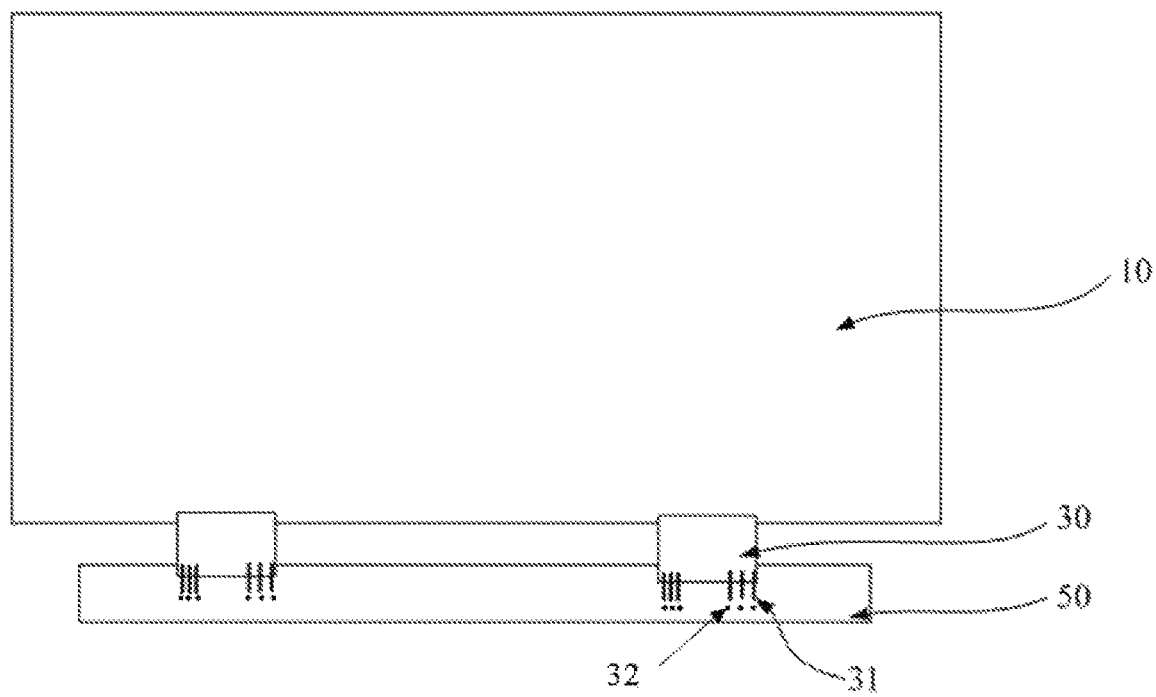
FIG. 1 is a structural view of an embodiment of a display device of the present application.

| Reference numeral | Name |
|---|---|
| 100 | display device |
| 10 | display panel |
| 30 | driver chip |
| 31 | pin |

-continued

| Reference numeral | Name |
| --- | --- |
| 311 | second impedance pin |
| 313 | first impedance pin |
| 50 | driving circuit board |
| 32 | circuit board contact point |

With reference to the drawings, the implement of the object, features and advantages of the present application will be further illustrated in conjunction with embodiments.

DETAILED DESCRIPTION OF THE EMBODIMENTS

The technical schemes of embodiments of the present disclosure will be clearly and completely described in the following with reference to the accompanying drawings. It is obvious that the embodiments to be described are only a part rather than all of the embodiments of the present disclosure. All other embodiments obtained by persons of ordinary skill in the art based on the embodiments of the present disclosure without creative efforts shall fall within the scope of protection of the present disclosure.

It should be noted that all directional indications (such as up, down, left, right, front, back, . . . ) in the embodiments of the present application are only used to explain the relative positional relationship, motion situation and the like between components in a certain posture (as shown in the drawings), if the specific posture changes, the directional indication shall also change accordingly.

In the present disclosure, the terms "connection", "fixation" and the like should be broadly understood, unless otherwise clearly indicated and specified, for example, "fixation" may refer to a fixed connection, or a detachable connection, or an integration, or a mechanical connection, or an electric connection, or a direct connection, or an indirect connection realized through an intermediate medium, or an internal communication or an interaction relationship of two elements, unless otherwise indicated clearly. Specific meanings of the foregoing terms in the present disclosure can be appreciated by persons of ordinary skill in the art according to specific circumstances.

In addition, the descriptions of "first", "second" and the like in the present application are used for the purpose of description only, and are not to be construed as indicating or implying their relative importance or implicitly indicating the number of technical features indicated. Therefore, the characteristics indicated by the "first", the "second" can express or impliedly include at least one of the characteristics. In addition, technical schemes of different embodiments can be combined with each other, however the technical solutions must base on that persons of ordinary skill in the art can realize the technical solutions, when the combination of the technical solutions occurs contradiction or cannot realize, it should consider that the combination of the technical solutions is impractical, and is not contained in the protection scope required by the present disclosure.

The present application proposes a display device 100, which may be a television, a computer, or a mobile terminal.

Figure 2:
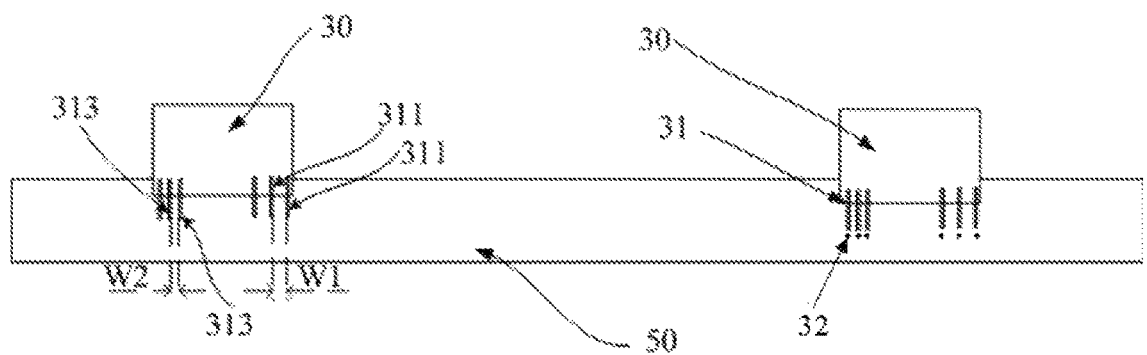
FIG. 2 is a structural view showing a connection of a part of a pin between a driving circuit board and a driver chip in the display device of the present application.
Figure 3:
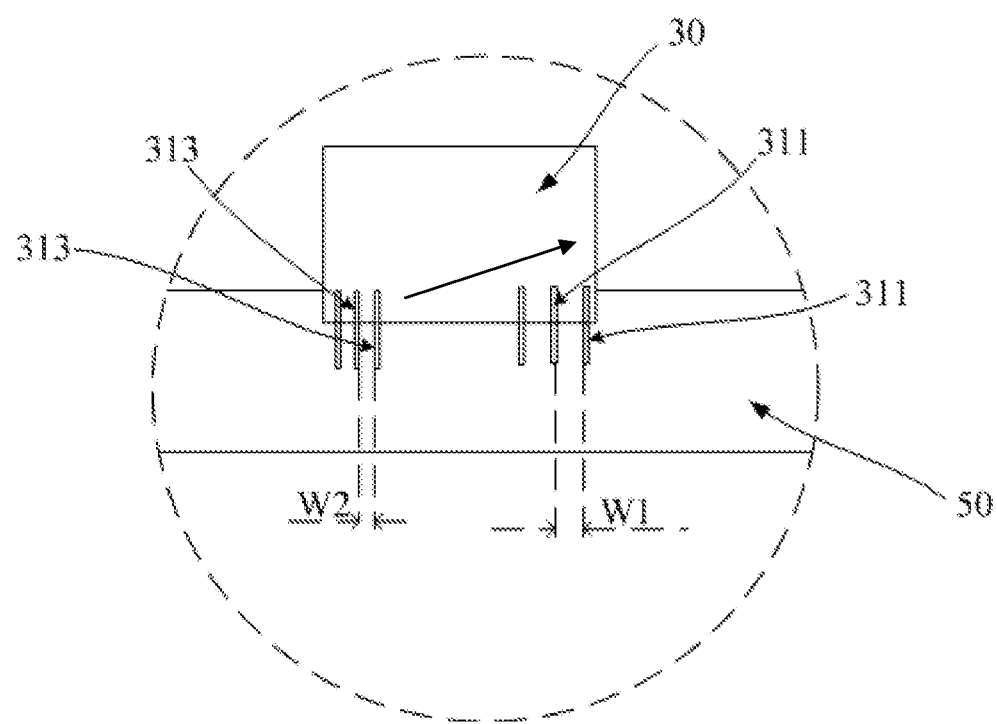
FIG. 3 is a partial enlarged view of A in FIG. 2.

Referring to FIG. 1 to FIG. 3, in the embodiment of the present application, the display device 100 includes:

a display panel 10;

In an embodiment of the present application, the display panel 10 may be a liquid crystal display panel. A liquid crystal display panel taken as an example includes two substrates disposed oppositely, one of which is an array substrate, and the other of which is a color film substrate.

The color film substrate is mainly composed of a matrix composed of red, green and blue colors and ITO as a common electrode. The array substrate is a matrix composed of metallic circuits and crystal diodes. The thickness of the substrate of the present application can be set to 0.4 mm to 0.7 mm, thereby making the thickness of the substrate thinner, making the overall thickness of the display panel 10 thin. The substrate is made of a glass substrate and can be divided into two types: alkali glass and alkali-free glass. Alkali glass includes both soda glass and neutral borosilicate glass, which are mostly applied to TN and STN LCDs, and are mainly produced by the float technology manufacture procedure. The alkali-free glass is mainly made of Alumino Silicate Glass (main component: $SiO_2$, $Al_2O_3$, $B_2O_3$, BaO, etc.), and its total alkali metal content is less than 1%, and is mainly used for TFT-LCD.

When the array substrate and the color film substrate are attached to the box, the glass substrate at the edge thereof is provided with a sealant. The sealant is an adhesive that bonds the upper and lower substrates of the LCD screen while maintaining a certain gap, and then seals the injected liquid crystal so that it does not leak and prevents external contaminants from entering. The adhesive is the sealant, also known as the edge sealing sealant. There are two main types of sealant for the LCD screen: thermocuring adhesive and ultraviolet (UV) curing adhesive. The main difference between the two types of adhesives is the way they are cured. Thermocuring adhesives are widely used. However, UV curing adhesive is superior to thermocuring adhesive in curing time, adhesion, moisture resistance and heat resistance and other aspects in production of the high-precision liquid crystal display. In particular, the curing time is short, which shortens the production cycle, and prevents the misalignment of the two sheets of glass during the long-term curing process. The UV curing adhesive is optional for the present disclosure, and the composition is a denatured acrylate compound, and the appearance is a yellowish viscous liquid. During work, the gel-like UV curing adhesive is uniformly applied to the frame of the upper glass surface, and the upper and lower substrates are bonded, after which the ultraviolet light is irradiated to crosslink the adhesive from a linear macromolecular structure into a stable network structure which has a strong adhesion ability to bond the two sheets of substrates together.

The display panel 10 generally includes an active area and a non-display area.

The active area refers to an area in which the substrate can display a character image, and can be disposed in a central portion of the substrate. The active area is generally filled with a liquid crystal and an alignment film (PI film). The alignment film is a film having a straight strip scratch, and serves to guide the alignment direction of the liquid crystal molecules. For example, on a glass substrate which has been vaporized with a transparent conducting film (ITO), strips of parallel grooves are printed on the ITO film by using a PI masking liquid and a roller. The liquid crystal then can follow the direction of the groove to lie in the groove to achieve the purpose of aligning the liquid crystal in the same direction. The material of the alignment film needs to have good optical penetration; it must be ionized or partially ionized; it has a covalent or partially covalent link; amorphous and good lattice structures. Polyimide is optional for the present application, and polyimide refers to a type of polymer containing an imide ring (—CO—NH—CO—) in the chain backbone, among which it is of the most importance that the polymer contains a phthalimide structure. As a special engineering material, polyimide has been widely used in aviation, aerospace, microelectronics, nano, liquid crystal, separation membrane, laser and other fields. Polyimide has the advantage that the initial decomposition temperature is generally around 500° C. The polyimide synthesized from pyromellitic dianhydride and p-phenylenediamine has a thermal decomposition temperature of 600° C., and is one of the highest thermalstability of polymers in the prior art. Polyimide can also withstand extremely low temperatures, such as in liquid helium at −269° C. without brittle fracture. Polyimide has excellent mechanical properties, the tensile strength of unfilled plastic is above 100 Mpa, the film of polypyromellitimide (Kapton) is above 170 Mpa, and that of the biphenyl-polyimide (Upilex S) reaches 400 Mpa. As engineering plastics, the modulus of elasticity is usually 3-4 Gpa, and that of the fiber can reach 200 Gpa. According to theoretical calculation, the modulus of elasticity of the fiber synthesized by pyromellitic dianhydride and p-phenylenediamine can reach 500 Gpa, second only to that of the carbon fiber. Some polyimides are insoluble in organic solvents and are stable to dilute acids. The general varieties are not anti-hydrolysis. This seemingly disadvantageous property makes polyimide have a very different feature from other high performance polymers, ie., raw materials of dianhydride and diamine can be recovered by alkaline hydrolysis, for example, for Kapton film, the recovery rate can reach 80%-90%. Changing the structure can also result in a variety that is quite anti-hydrolysis, such as being subject to boiling at 120° C. for 500 hours. Polyimide has high irradiation resistance, and the strength retention of its film is 90% after the fast electron irradiation of $5 \times 10^9$ rad. Polyimide has good dielectric properties, and a dielectric constant of about 3.4. The dielectric constant can be reduced to about 2.5 if fluorine is drawn into, or the nanoscale of air is dispersed in polyimide. The dielectric loss is $10^{-3}$, the dielectric strength is 100-300 KV/mm, and the extensively formed thermoplastic polyimide is 300 KV/mm. These properties are maintained at a high level within a wide range of temperature and frequency. Polyimide is a self-extinguishing polymer with a low fuming rate. The outgassing quantity of polyimide is quite little under extremely high vacuum. Polyimide is non-toxic and some polyimides also have good biocompatibility.

The non-display area refers to an area in which the character image cannot be displayed, and is generally disposed around the active area. The circuit routing and other driven electronic components are disposed there. The connection area between the display panel 10 and the driver chip 30 of the present application is disposed in the non-display area of the display panel 10.

A driver chip 30. The driver chip 30 is electrically connected to the display panel 10, the driver chip 30 is provided with a plurality of chip pins 31 disposed spaced from each other, and the distance between at least two adjacent chip pins 31 is different from that between the other two chip pins 31;

The driver chip 30, also known as driver IC, is the main part of the display imaging system, which integrates resistors, regulators, comparators and power transistors, including the lcd module and display subsystem, which is responsible for driving the display and controlling the drive current, etc. by two methods: static drive and dynamic drive.

And a driving circuit board 50. The driving circuit board 50 is provided with a plurality of circuit board contact points 32, and a circuit board contact point 32 is connected to a chip pin 31 correspondingly.

The driving circuit board 50 is used to mount the driver chip 30. The driving circuit board 50 is provided with a circuit board contact point 32, and the circuit board contact point 32 corresponds to the chip pin 31.

The distance value between two adjacent chip pins 31 is set to be different from the distance value between another two adjacent chip pins 31 of the plurality of chip pins 31 of the driver chip 30, and the circuit board contact points 32 of the driving circuit board 50 and the chip pins 31 of the driver chip 30 corresponds one by one, so the distance value between the two adjacent board contact points and another two adjacent circuit board contact points 32 of the driving circuit board 50 is also set to be different. In this way, adaptive settings can be made according to chip pins 31 with different signal functions, thereby maximizing the performance of the display device 100 using chip pins 31 of different sizes and spacings.

Referring to FIGS. 2 and 3, it will be understood that only a portion of the pins are illustrated in FIG. 2. In an embodiment of the present application, the plurality of the chip pins 31 include a first impedance pin 313 and a second impedance pin 311. A distance value between the two second impedance pins 311 is defined as W1, and the distance value between the two first impedance pins 313 is defined as W2, and W1>W2;

The impedance of the first impedance pin can optionally be set to be greater than that of the second impedance pin. Thus, the current running through the second impedance pin 311 is large under the same voltage. While the current running through the first impedance pin 313 is small under the same voltage. That is, for a chip pin 31 with a high frequency of the transmission signal, a large current voltage and a lower impedance, it is required to be designed to be large, and the distance value of W1 is increased. For a chip pin 31 with a low frequency of the transmission signal, a small current voltage and a large impedance, it is required to be designed to be small, and a low distance value of W2 is used. With this arrangement, the performance of the chip pins 31 is effectively improved and the overall performance of the product of the display device 100 is improved in a limited space.

Further, the range of the distance value W1 between the two second impedance pins 311 is: 0.3 mm≤W1≤0.6 mm.

The distance value W1 between the second impedance pins 311 cannot be too small, which may interfere between the two chip pins 31. For example, when it is less than 0.3 mm, the signal transmission capability between the second impedance pins 311 is poor. The distance value W1 between the second impedance pins 311 cannot be too large, which would occupy too much of the assembly space. For example, when it is larger than 0.6 mm, it is inconvenient to process and assemble. Therefore, the design is 0.3 mm≤W1≤0.6 mm, for example, 0.3 mm, 0.35 mm, 0.4 mm, 0.45 mm, 0.5 mm, 0.55 mm, 0.6 mm.

In an embodiment of the present application, the range of the distance value W2 between the two first impedance pins 313 is: 0.1 mm≤W2≤0.3 mm.

The distance value W2 between the first impedance pins 313 cannot be too small, which may interfere between the two chip pins 31. For example, when it is less than 0.1 mm, the signal transmission capability between the second impedance pins 311 is poor. The distance value W2 between the second impedance pins 311 cannot be too large, which would occupy too much of the assembly space. For example, when it is larger than 0.3 mm, it is inconvenient to process and assemble. Therefore, the design is 0.1 mm≤W1≤0.2 mm, for example, 0.1 mm, 0.15 mm, 0.2 mm, 0.25 mm, and 0.3 mm. It can be understood that in an embodiment of the present application, the distance value W2 between the first impedance pins 313 is set to be smaller than the distance value W1 between the second impedance pins 311. Therefore, when W1=0.3 mm, W2 cannot select a distance value of 0.3 mm.

In an embodiment of the present application, the second impedance pin 311 includes a signal transmission pin. That is, the second impedance pin 311 can be used to transmit digital signals and control signals.

In an embodiment of the present application, the first impedance pin 313 includes a ground pin and a fill pin. That is, the first impedance pin 313 can be used to pass current.

In an embodiment of the present application, the driving circuit board 50 is provided with spliced eyes formed as circuit board contact points 32, and one of the chip pins 31 is inserted-connected to one of the spliced eyes.

That is, the driver chip 30 of the present application is mounted on the driving circuit board 50 by splicing, and the driver chip 30 can be inserted-connected to the driving circuit board 50 relatively simply and conveniently this way.

In an embodiment of the present application, the driving circuit board 50 is provided with a mounting point formed as the circuit board contact point 32, and one of the chip pins 31 is mounted and welded on one of the circuit board contact points 32.

SMT can be used in the process of SMT mounting, which is surface mount technology (short for Surface Mounted Technology). It is a circuit-mounting technology that mounts surface mount components (short for SMC/SMD, referred to as chip components in Chinese) without pins or short of lead pins on the surface of printed circuit boards (Printed Circuit Board, PCB) or other substrates and solders them by reflow soldering or dip soldering. The basic technology components of SMT include: silk screen (or adhesive dispensing), mounting (curing), reflow soldering, cleaning, inspection, and rework. Silk screen: its function is to skip print solder paste or mount adhesives on the bonding pad of PCB to prepare for soldering of components. The device used is a screen printing machine (screen process press), located at the forefront of the SMT production line. Adhesive dispensing: it is to drop glue on a fixed position on the PCB. Its main function is to fix the components to the PCB. The device used is a glue dispenser located at the forefront of the SMT production line or behind the testing device. Mounting: its function is to accurately mount surface mount components to a fixed position on the PCB. The device used is a chip mounter located behind the screen printing machine of the SMT production line. Curing: its function is to melt the mount adhesives, so that the surface mount components and the PCB board are firmly bonded together. The device used is a curing oven located behind the chip mounter of the SMT production line. Reflow soldering: its function is to melt the solder paste, so that the surface mount components and the PCB board are firmly bonded together. The device used is a reflow oven located behind the chip mounter of the SMT production line. Cleaning: its function is to remove the scaling powder and other welding residues on the assembled PCB board that are harmful to the human body. The device used is a cleaning machine, the position can be fixed which can be on the line or not. Inspection: its function is to test the welding quality and assembly quality of the assembled PCB. The device used includes a magnifying glass, a microscope, an in-circuit tester (ICT), a flying probe tester, an automatic optical inspection (AOI), an X-RAY inspection system, and a function tester, etc. The position can be configured in a suitable place on the production line according to the needs of the inspection. Rework: its function is to rework PCB boards that have failed. The tools used are soldering irons, rework stations, etc. They are configured anywhere in the production line. Advantages of SMT chip processing: high assembly density, small size and light weight of electronic products. The size and weight of chip components are only about 1/10 of that of traditional plug-in components. After SMT is generally used, the volume of electronic products is reduced by 40%-60%, and the weight is reduced by 60%-80%. The reliability is high and the anti viberation ability is strong. The solder joint defect rate is low. The high frequency response is good. It reduces electromagnetic and radio-frequency interference. It is easy to realize automation and increase productivity. The cost is reduced by 30% to 50%. It can save materials, energy, device, manpower, time, etc.

Referring to FIG. 1, in an embodiment of the present application, the display device 100 comprises two driver chips 30, and the two driver chips 30 are disposed apart from each at both ends of the driving circuit board 50. The driving of the display panel 10 can be better achieved by the two driver chips 30. Of course, it is also possible to propose a plurality of driver chips 30 or one driver chip 30, which is also within the scope of protection of the present application.

The above mentioned is only the alternative embodiment of the present disclosure, which does not limit the patent scope of the present disclosure, and any equivalent structure transformation made by using the specification and the drawings of the present disclosure or direct/indirect applications in other related technical fields should be contained in the scope of patent protection in a similar way.

What is claimed is:

1. A display device, comprising:
   a display panel;
   a driver chip electrically connected to the display panel, the driver chip is provided with a plurality of chip pins disposed spaced from each other, and a distance between at least two adjacent chip pins is different from a distance value between the other two chip pins; and
   a driving circuit board, the driving circuit board is provided with a plurality of circuit board contact points, and a circuit board contact point is connected to a chip pin correspondingly; wherein:
   the plurality of the chip pins comprise a first impedance pin and a second impedance pin, a distance value between the two second impedance pins is defined as W1, and a distance value between the two first impedance pins is defined as W2, W1 is greater than W2, W1 is no less than 0.3 mm and no greater than 0.6 mm, and W2 is no less than 0.1 mm and no greater than 0.3 mm.

2. The display device according to claim 1, wherein the second impedance pin comprises a signal transmission pin.

3. The display device according to claim 1, wherein the driving circuit board is provided with a mounting point formed as the circuit board contact point, and one of the chip pins is mounted and welded on one of the circuit board contact points.

4. The display device according to claim 1, wherein the driving circuit board is provided with a mounting point formed as the circuit board contact point, and one of the chip pins is mounted and welded on one of the circuit board contact points.

5. The display device according to claim 1, wherein the display device comprises two of the driver chips, and the two of the driver chips are disposed apart from each at both ends of the driving circuit board.

6. The display device according to claim 1, wherein the display device comprises two of the driver chips, and the two of the driver chips are disposed apart from each at both ends of the driving circuit board.

7. The display device according to claim 1, wherein the display device comprises a television, a computer or a mobile terminal.

* * * * *